United States Patent
Hans et al.

[11] Patent Number: 6,112,062
[45] Date of Patent: Aug. 29, 2000

[54] PREDISTORTION FOR HIGH POWER AMPLIFIERS

[75] Inventors: Ravinder Hans, Littleton, Mass.; Bernard J. Arntz, Morristown, N.J.

[73] Assignee: The Whitaker Corporation, Wilmington, Del.

[21] Appl. No.: 08/939,040

[22] Filed: Sep. 26, 1997

[51] Int. Cl.$^7$ ................................. H04B 1/04; H03F 1/26
[52] U.S. Cl. ........................ 455/114; 455/126; 330/149
[58] Field of Search ........................... 455/235.1, 234.1, 455/234.2, 232.1, 230, 217, 250.1, 254, 114; 330/151, 149, 158; 375/296, 295

[56] References Cited

U.S. PATENT DOCUMENTS

| | | | |
|---|---|---|---|
| 4,194,154 | 3/1980 | Kahn | 455/114 |
| 4,554,514 | 11/1985 | Whartenby et al. | 330/149 |
| 4,672,327 | 6/1987 | Wittlinger | 330/269 |
| 5,105,445 | 4/1992 | Karam et al. | 375/60 |
| 5,489,875 | 2/1996 | Cavers | 330/151 |
| 5,493,252 | 2/1996 | Takai | 330/151 |
| 5,699,383 | 12/1997 | Ichiyoshi | 375/296 |
| 5,760,646 | 6/1998 | Belcher et al. | 330/149 |
| 5,886,572 | 3/1999 | Myers et al. | 330/149 |

*Primary Examiner*—Dwayne D. Bost
*Assistant Examiner*—Erika A. Gary

[57] ABSTRACT

A predistorter for linear amplification of a complex modulated signal has an input stage, an envelope detector having at least one fast diode and a capacitor at an output for measuring an amplitude of an RF signal, first and second differentiators for taking first and second derivatives with respect to time; and a predistorter controller for adjusting an attenuator and phase shifter based upon the derivatives.

3 Claims, 5 Drawing Sheets

PREDISTORTION FOR HIGH POWER AMPLIFIERS

FIELD OF THE INVENTION

The present invention relates to a predistorter for high power amplifiers to provide a more linear response.

BACKGROUND OF THE INVENTION

Complex modulation in which both amplitude modulation and phase/frequency modulation are effected to increase spectral efficiency is widely used in a variety of communications applications. In a variety of communications applications, high power amplifiers are necessary to assure proper signal power is delivered. High power amplifiers of the Class AB type in particular unfortunately will distort modulated RF signals, particularly those signals which have complex modulation schemes, resulting in intermodulation distortion appearing at the output of the amplifier. These distortion products result in undesired frequency components, and often frequency components that will violate strict FCC bandwidth requirements. A variety of techniques have been employed to reduce intermodulation distortion. These include feedback techniques, feedforward techniques and predistortion. The ultimate goal in each of these attempts to reduce intermodulation distortion is to provide a more linear response from the amplifier. Although feedforward linearization often yields significant signal improvement, and works well with broadband signals, it requires an extra power amplifier, known as an error amplifier, and therefore greatly increases the cost and complexity of the system. Feedback requires a feedback delay, often limiting the usefulness to lower frequency applications.

Predistortion is an alternative to feedforward, and almost always consumes less power. Predistortion and feedforward are often used together if the performance requirements are extreme. This patent addresses only the predistortion aspect.

Predistorters can be of two varieties: 1) RF predistorters, in which the RF is applied to an element or group of elements which operate at the RF frequency, such as an expanding amplifier or nonlinear RF device, and 2) Envelope predistorters, in which the incoming RF is amplitude detected and the level is used to modulate gain and phase adjusters which precede the main power amplifier. In this type, the nonlinear curve shaping networks (analog or digital) operate on the envelope (baseband) signal, at a much lower frequency than the RF. This disclosure of the invention of the present discussed in the "Detailed Description of the Invention" below addresses the second variety.

To utilize predistortion, an input signal to an amplifier must be intentionally distorted in an inverse manner such that when it is applied to the amplifier, the output from the amplifier is linear with respect to the input. The gain (AM to AM modulation) and phase (AM to PM modulation) characteristics of a predistorted signal should be mirror images of the amplifier response to effect the necessary changes in the output signal to linearize the output signal. Predistortion techniques have been used for some time to linearize power amplifiers.

In the present art, there is a time delay issue which limits the speed of operation. For any digital predistorter which uses the envelope amplitude as an index to a correction table, the processes of detection, A/D conversion, table look up, D/A, and AM/PM modulation have to be completed in 5% or less of the data period of the modulation for the predistortion to have a significant cancelling effect. As in the case of adding two vectors roughly 180 degrees apart, small angle errors result in a significant residual. In a system with an eye pattern having data bit transitions at 1 MHz, the delay through the entire predistorter path from the RF input to the RF output should be no more than 50 nS (In most cases the envelope is bandlimited and has very gradual transitions in the time domain. The envelope is continually changing). This places significant speed requirements on the circuit elements, allowing only a 10 nS average budget for each of the elements in this example.

This application addresses the speed problem with a look ahead circuit. Based on the very gradual and well defined envelope transitions, the look ahead circuit provides envelope information that leads the detected envelope by 15% or more With this incorporation, the A/D, look up table, and D/A processes have 20% (in this example) of the data period, rather than 5%, to process the amplitude.

Envelope predistorters using analog circuits and non-linear envelope circuits, while in many applications are faster than the digital approaches because translation in and out of the digital domain is not required, may still benefit from a look ahead approach. These analog circuits and non-linear devices, while useful, are difficult to adjust and do not have the advantages of digital circuits such as arbitrary curve generation and automatic calibration. Because of the extra operations, digital predistortion has been limited to baseband operations in many cases.

Baseband approaches have also been used which have predistortion back in the radio, before modulation up to RF. These techniques have the advantage of digital look ahead, because the modulation can be delayed to meet up with the delayed predistortion. However, these techniques require an intricate information connection between the radio and the power amplifier. Predistortion using only the RF signal without access to the premodulated signal, has the advantage that the amplifier can be a stand alone unit without any input other than the RF. That is, the radio/modulator and the amplifier do not need to be matched, calibrated, or purchased together.

Accordingly, what is needed is a technique to effect analog or digital predistortion using the RF signal alone with a look ahead circuit.

SUMMARY OF THE INVENTION

As in a typical RF system with complex (amplitude and phase) modulation, an incoming signal is applied to an amplifier. In the present invention this signal is input to a sequential attenuator which is a dynamically variable attenuator and a phase shifter which is also a dynamically variable component. A portion of the incoming signal is amplitude detected by an envelope detector and applied to a double differentiator circuit. By taking first and second partial derivatives of the envelope with respect to time, and combining these signals with the detected envelope in specific ratios, an earlier version of the input signal can be approximated. This approximation is shown in FIG. 4. This look ahead effect is useful for bandlimited signals where the rise times are smooth and limited, and where the envelope shapes are fixed and known by virtue of the transmit filter. This is true in most frequency division multiplexing modulation schemes.

Because the rise and fall shapes are similar for all data, a prediction can be made of the instantaneous envelope value to come, based on the envelope value at a given time and the immediate history of the envelope. That is, by knowing the time rate of change of the amplitude (the first derivative with respect to time), as well as the time rate of change of the slope of the amplitude (the second derivative with respect to time), at a particular amplitude level, the future level of the envelope can be determined as the envelope begins to change.

Accordingly, through the information obtained by the amplitude level, as well as the first and second derivatives with respect to time of the amplitude, the amount or degree to which attenuation must be increased or reduced in order to provide a more linear output from the amplifier can be readily determined. This is effected by the look up table (or nonlinear analog circuit), and corrected with the dynamically variable attenuator. Additionally, as is well known to one of ordinary skill in the art, an RF signal will often shift by a certain factor of phase by a particular amount at a particular amplitude value. This is known as AM to PM modulation. The dynamically variable phase shifter is used to predistort the phase of the signal as well. Accordingly, the system of the present disclosure is designed to attempt to correct for the effects of AM to AM and AM to PM non-linear characteristics as through a predistortion scheme.

In the preferred embodiment, a portion of the signal is amplitude detected, applied to the double differentiator circuit and digitized. The digital amplitude information is used to look up correction factors for gain and phase. These correction factors are applied to the dynamically variable attenuator and dynamically variable phase shifter according to the modulation of the signal. The resulting signal applied to the amplifier has amplitude and phase characteristics that are nearly the inverse of the amplifier. The resulting output signal from the amplifier has a noticeably more linear response than the amplifier would by itself. In some implementations of conventional techniques, a delay line may be placed between the RF input and the attenuator to allow a for additional processing time if required. This delay line has the same effect as the look ahead circuit in the sense that it allows more processing time in the look up operation, because the RF signal is delayed. However, RF delays of more than a few nanoseconds require bulky and lossy cables. In this invention, look ahead times of about 150 ns can be obtained for modulation rates of 800 ns/symbol.

OBJECTS, FEATURES AND ADVANTAGES OF THE PRESENT INVENTION

It is an object of the present invention to have a predistortion technique for linearizing the output of high power amplifiers at RF frequencies, particularly CDMA frequencies.

It is a feature of the present invention to periodically sample the RF input, take first and second derivatives of the sample with respect to time and through a look-up table in random access memory make necessary adjustments to an in-line attenuator and phase shifter to effect linear output from the amplifier.

It is a further feature of the present invention to combine a look ahead (double differentiator) circuit with a conventional envelope predistorter to significantly increase the speed at which corrections can be made, thereby having the ability to operate on faster modulation rates compared to prior art.

It is an advantage of the present invention to effect lineariziation of the high frequency signals through relatively uncomplicated structures and circuitry.

BRIEF DESCRIPTION OF THE DRAWINGS

FIG. 5 can also be implemented with nonlinear analog circuits, an example of which is shown in FIG. 5a.

DETAILED DESCRIPTION OF THE INVENTION

Figure 3:
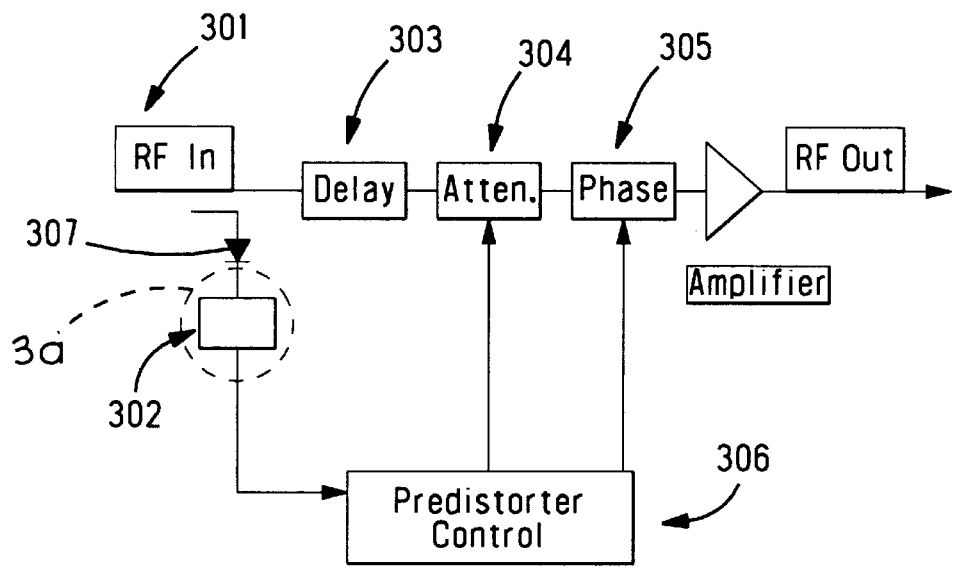
FIG. 3 is a function block diagram of the predistorter and amplifier circuit of the present invention.
Figure 3A:
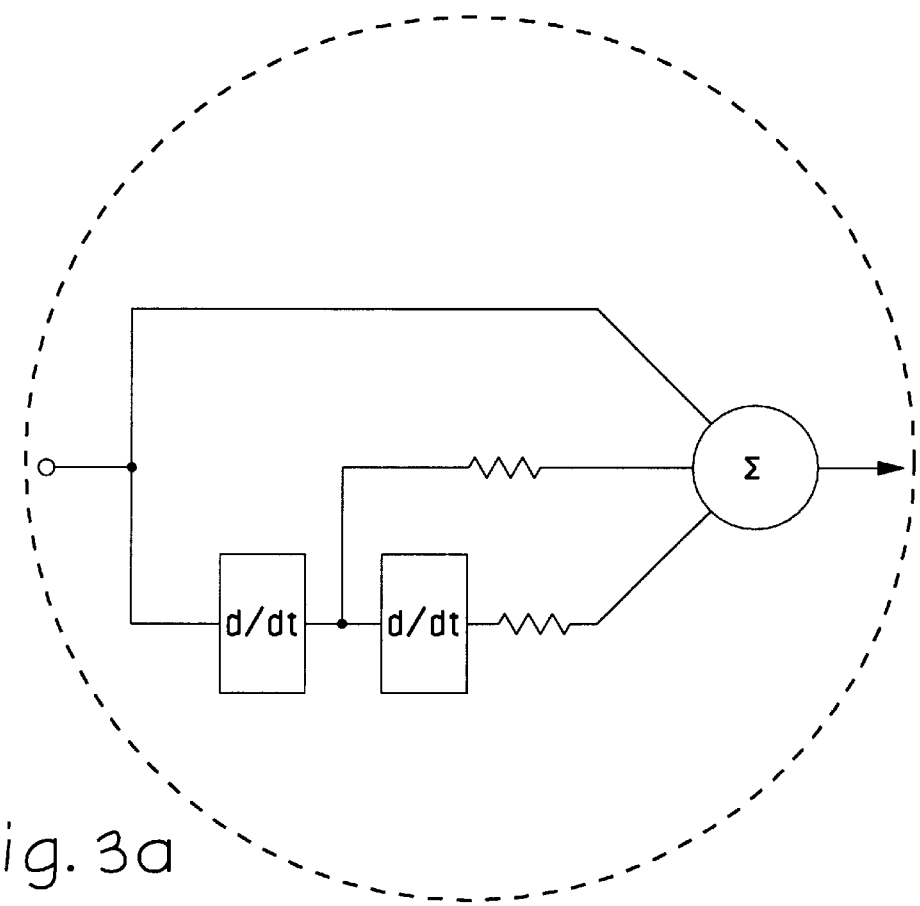

Turning to FIG. 3, a typical block diagram of the preferred embodiment of the present disclosure is shown. The RF input signal 301 is partially coupled to an envelope detector 307 which feeds the double differentiator circuit 302. An RF delay is shown at 303, implemented as a cable or a filter, is optional and shown for completeness. This delay in the RF path in theory reduces the requirements for the amount of time that the look ahead circuitry has to compensate for, however in practice it must have delay on the general order of many tens of nanoseconds to be effective, which means many tens of feet of cable.

The RF signal is sampled at a rate of at least 10 times the modulation rate of the RF signal.

For any digital predistorter which uses the envelope amplitude as an index to a correction table, the A/D, look up table, and D/A processes have to be completed in 5% or less of the data period of the modulation for the predistortion to have a significant effect. The look ahead circuit provides envelope information that is 15% or more ahead of the amplitude transitions. With this incorporation, the A/D, look up table, and D/A processes have 20% (in this example) of the data period, rather than 5%, to process the amplitude.

Figure 4:
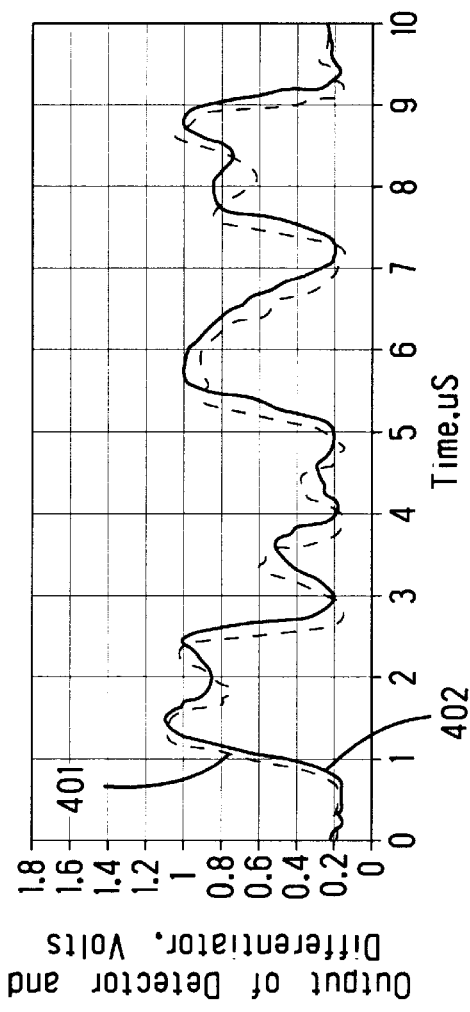
FIG. 4 is a graphical representation of the envelope signal as well as the predicted envelope signal graphed versus time.

As stated previously, by detecting the amplitude of the RF input signal and first and second time derivatives of this value taken from the envelope detector, it is possible to make necessary adjustments in gain by the attenuator 304 and phase through the phase shift mechanism 305. The main objective of the present invention is to predict where the amplitude of the envelope is "going" before it is input to the look up tables. To this end, from known values of amplitude, first derivative of this amplitude value (to determine the slope) and second derivative of the amplitude value to determine the time rate of change of the slope, the shape of the incoming signal can be predicted about 15% of the bit period earlier than the envelope itself. Through this modeling technique, and by sampling the incoming signal at a large number of intervals, the envelope is predicted. This is as is shown in FIG. 4.

The envelope detection circuitry of the present invention effectively speeds up the edge information or amplitude transmissions of a band limited signal thereby enabling prediction of the incoming signal transitions. In FIG. 4, the solid line 402 is the original input RF signal, in this case CDMA. The dashed line 401 is an "early" version of the signal. As can be determined from the graph in FIG. 4, the early version (dashed line) is a very close approximation or model of the original signal and has transitions about 100 nanoseconds earlier than the original signal in this example. It is important to use the phrase "has transitions before", rather than saying that the "early signal" comes before the main signal. The differentiation process is not a precausal process. By predetermining the transitions 100 nanoseconds (for example) earlier through the detection and differentiation processes with respect to time, the linearity of the amplifier can be improved within the digital processing delay time period. That is, the correction can take place in real time at the modulation rate.

Based on the time domain response of the transmit filter that is normally used in the modulation process, the time constants and the weighting coefficients in the differentiation circuit can be adjusted to vary the amount by which the edges are advanced, to optimize the response and shape.

The output of the envelope detector 307 is input to the look ahead circuit 302 (also shown in enlarged view in FIG. 3) which is made up of the differentiators and summing device which sums the output from the differentiators in certain ratios, this data is input to the predistorter controller 306. As will be explained more fully below, random access memory in the form of a look-up table is in the controller. This is used to determine the required adjustments in the attenuator and phase shifter 304, 305, respectively. By adjusting the gain through attenuation as well as the phase, issues of intermodulation distortion due to non-linear response by the amplifier are largely eliminated, and undesired frequency components in side bands are eliminated accordingly.

Figure 5:
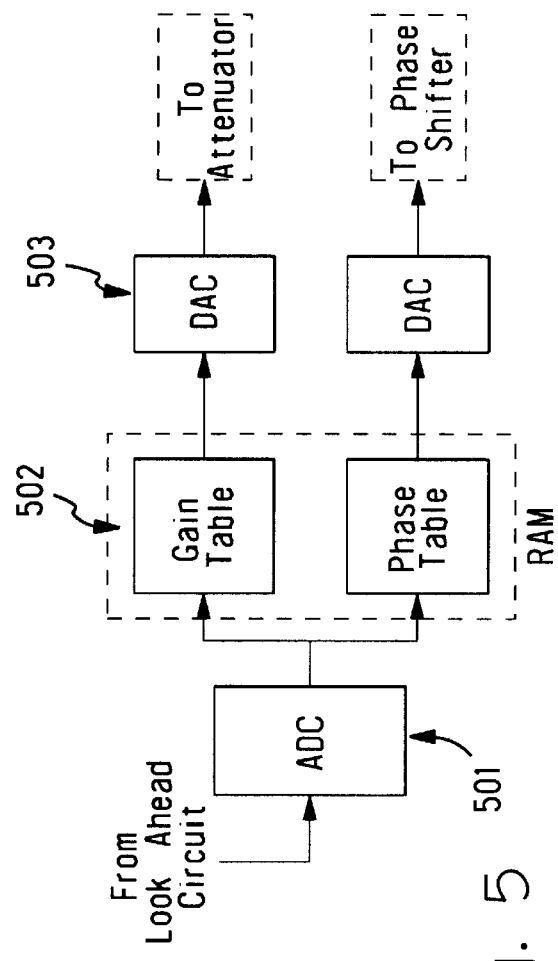
FIG. 5 is a block diagram of the digital section of the predistorter of the present disclosure coupled to the attenuator and phase shift mechanism of the present invention.

The envelope detector is implemented with a fast diode, with a small capacitor on its output such that the detected output follows either the RF voltage envelope or the RF power envelope, depending on how the diode is use the preferred embodiment, a digital predistorter is utilized. The advantage of a digital predistorter is that it allows the adaptability to each amplifier and the optimum predistorted signal can be realized for each amplifier. This allows one predistorter to be adjusted to custom fit multiple amplifiers. The required response can be found under automatic control of the RF equipment. However, in order to use a digital approach, the problems of bandwidth and digital processing speed must be considered. The digital predistorter 306 functions at a relatively quick rate, on the order of 50–60 nanoseconds. As is shown in FIG. 5, an analog digital converter 501 takes the input from the differentiating envelope detector (not shown) and digitizes this input. The digital circuitry consists of a very fast analog to digital converter 501, which has output then fed into the gain table and phase table shown as RAM 502. Fast digital to analog converters 503 are used to provide inputs to the attenuator and phase shifter. A micro-controller may be used to control the predistorter system and also communicate with external computers to allow downloading of the gain and phase correction tables. The analog to digital converter converts the detected signal from the differentiation detector in less than 1 clock cycle (25 nanoseconds). The ADC result is applied directly to the RAM address. One static RAM holds the gain correction and the other holds the phase adjustment as shown at 502. After 6 nanoseconds, the RAM outputs the required DAC input. The DAC is triggered by the delayed system clock edge and the conversion is performed in 20 nanoseconds. Thus the overall digital delay is on the order of 50–60 nanoseconds. Because the look ahead circuit can easily advance the timing by 100 nanoseconds, the digital delay, the conversion processes, and the envelope detection and modulation is easily compensated for.

As stated earlier, it is necessary to have a random access memory (RAM) table in order to look up the necessary digital correction A key to achieving the desired performance is determining the correct data for random access memory. In order to properly calibrate this system, a network analyzer is used to measure the response of the amplifier under normal operating conditions (without the predistorter). The analog to digital converter is calibrated by varying the power of a continuous wave signal. The resulting correction data is stored. The digital to analog converters are calibrated by loading them over the full range of operation and measuring the accompanying gain and phase changes. This information is then stored for future use. After the predistorter components are calibrated, the amplifier is connected to the system and its gain and phase responses are acquired from the network analyzer which is connected to an external computer. By reusing the previously calibrated results for the ADC and DAC's, the correct RAM data is generated and loaded into the RAM.

Figure 1:
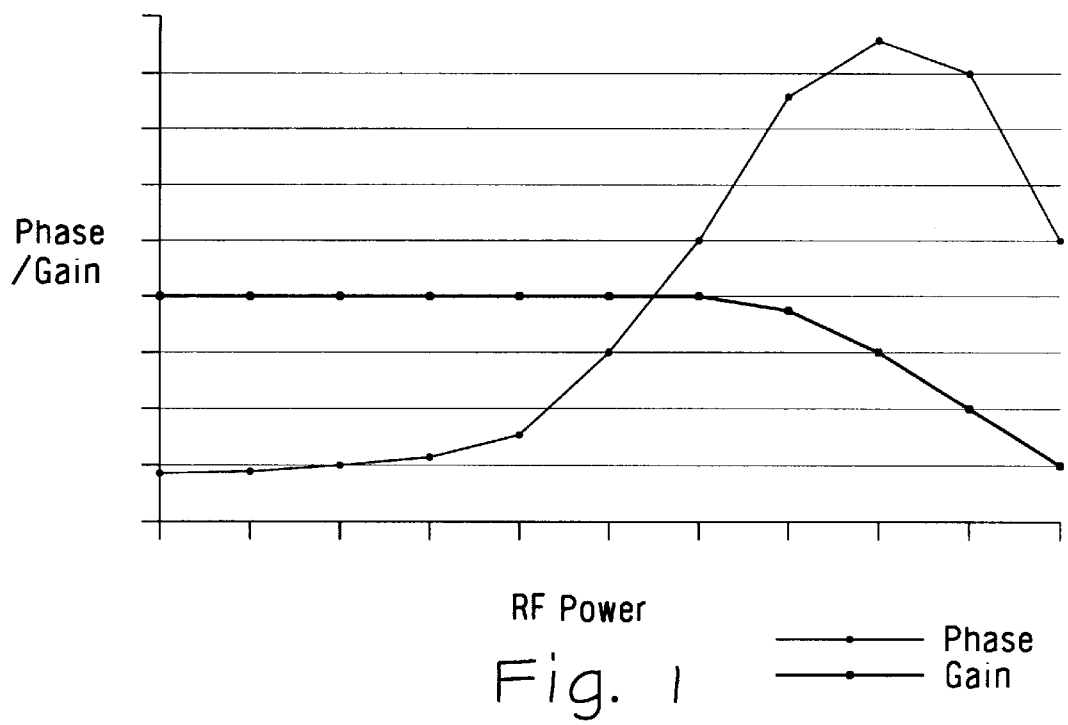
FIG. 1 is a graphical representation of a typical amplifier gain and phase response versus power.
Figure 2:
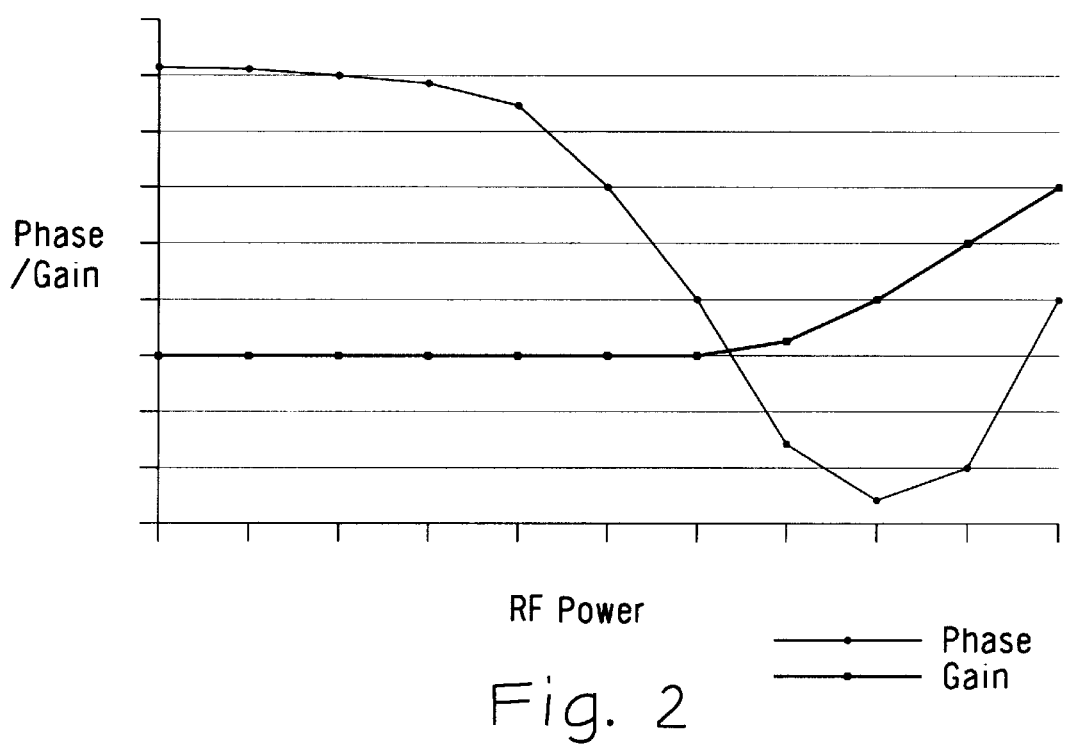
FIG. 2 is a graphical representation of predistorter gain and phase response versus power.

FIGS. 1 and 2 are used to show the overall objective of the predistortion. To use the predistortion as discussed above, the input signal to the amplifier must be distorted in a manner such that when it is applied to the amplifier the net result is a linear signal. The gain and phase characteristics of the predistorted signal would be mirror images of the amplifier response. FIG. 2 shows a typical gain and phase response through a predistorter. This is a virtual mirror image of the amplifier response of FIG. 1. That is, by knowing the required degree of attenuation and phase shift, the input to the amplifier can be predistorted to result in output from the amplifier being virtually linear.

Figure 5A:
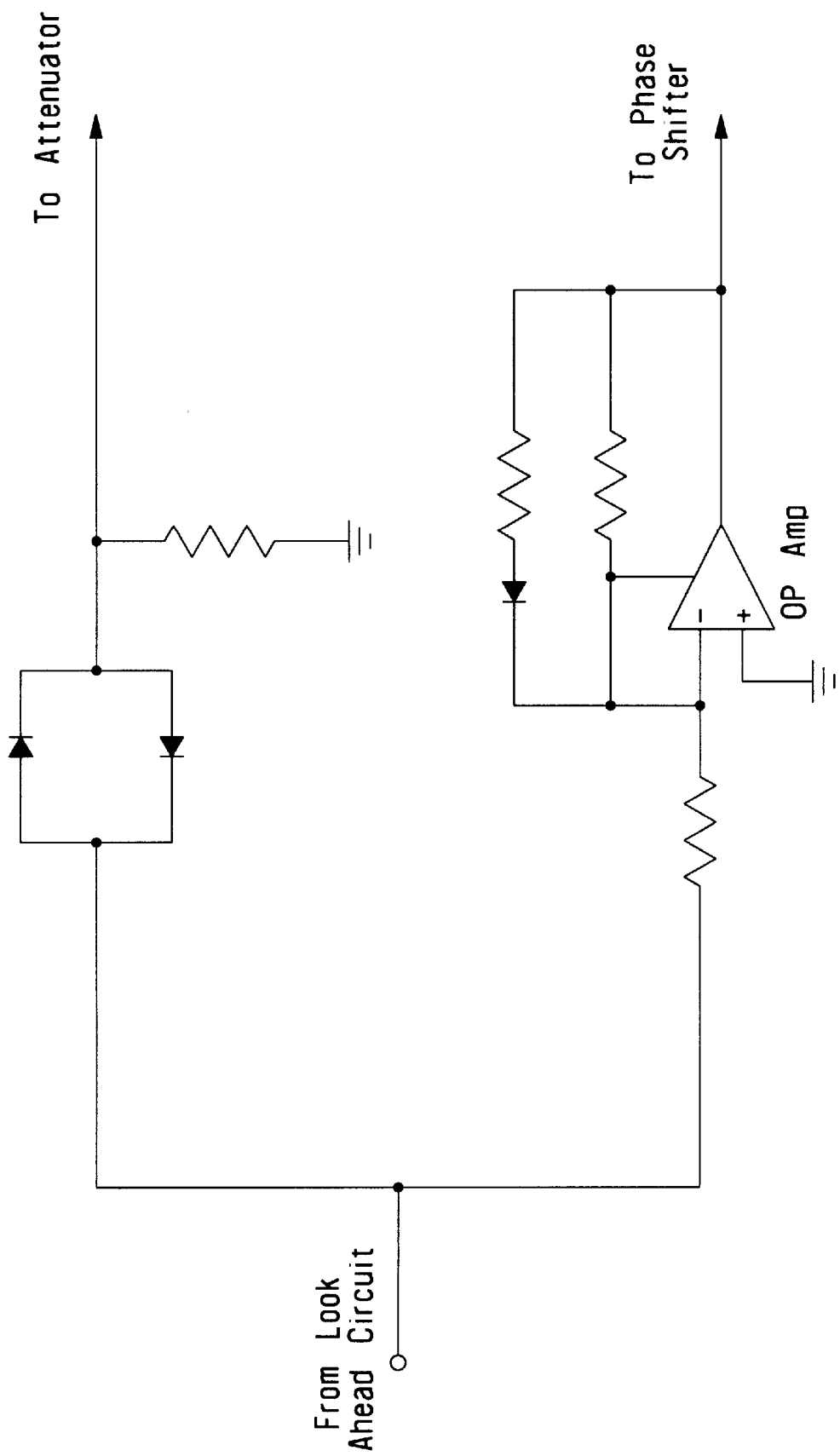
Figure 6:
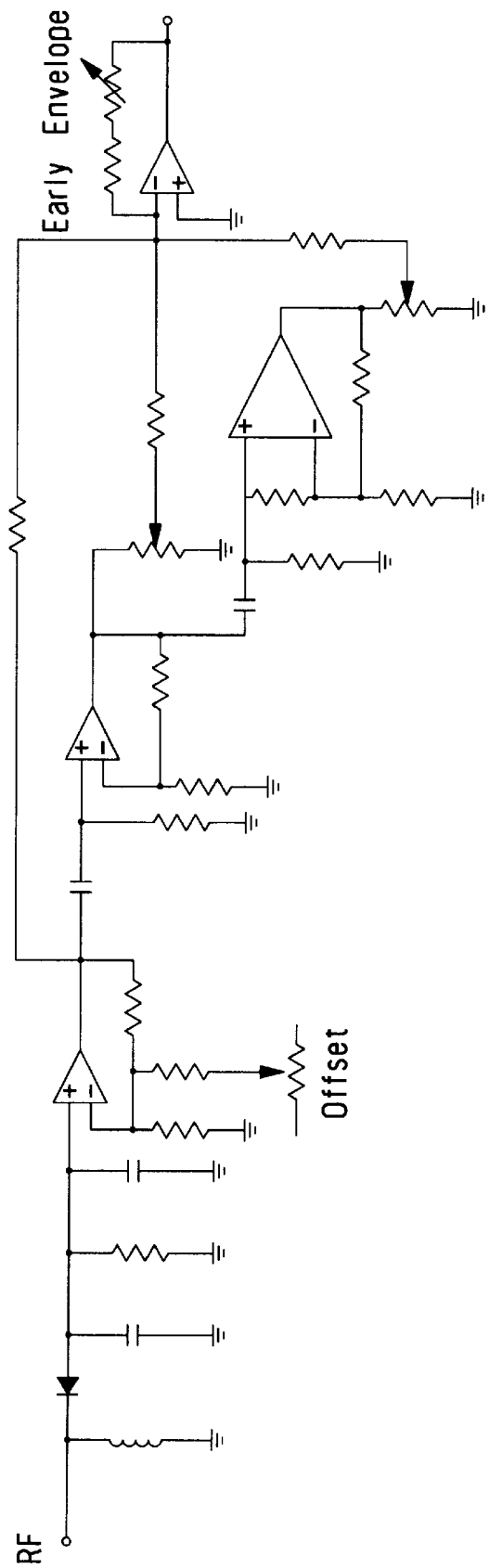
FIG. 6 is representative of a schematic diagram of the envelope detector and double differentiators of the preferred embodiment of the present disclosure.

The look up (shaping) process may be implemented using analog circuits as well as digital circuits, in which case the A/D converter and the DAC are not required. In this implementation (FIG. 5a), the look up process can be built into an analog curve shaper, which outputs a voltage that is a function of both the input voltage and the curve shape. In the preferred embodiment a digital circuit has been discussed. Through the technique of the preferred embodiment, spectral reduction correction on the order of many dB is readily achieved. The gain response is corrected to within 0.3 dB and the phase response to within 0.5 degrees. The above results are merely exemplary of the preferred embodiment. Through the digital technique discussed above, many dB of spectral reduction correction is readily achieved on various types of amplifiers.

In another embodiment of the present invention, the look ahead circuit can be implemented with a pre-emphasis network, being similar in function and operation to the double differentiator. In yet another embodiment not shown, the look ahead function can be implemented digitally by storing a few samples of the digitized envelope value and performing math on the stored samples to calculate an early version of the envelope (i.e. predict the next couple of samples based on the recent history of a few samples). This is essentially what is done with the analog double differentiator, with the capacitors being the storage elements.

Accordingly, by having a clear understanding of the transfer function of the amplifier as is shown in FIG. 1, a predistortion transfer function can be generated as shown in FIG. 2. By the digital technique in the preferred embodiment, the random access memory contains the correction curves to input the inverse or mirror image of the RF signal predicted by the double differentiation technique thus enabling the input to the amplifier to effectively predistort the signal for a linear output. Clearly, there are modifications and variations to the disclosure of the present invention which would be readily apparent to one of ordinary skill in the art having had the benefit of the present disclosure. To the extent that these modifications and variations are within the pervue of the artesian of ordinary skill, such are deemed to be within the scope of the present invention.

We claim:

1. A predistorter for linear amplification of a complex modulated signal comprising;

an input stage;

an envelope detector for measuring amplitude of an RF signal;

a double differentiator, said double differentiator taking first and second derivatives of said amplitude with respect to time;

a summing circuit, said summing circuit adding said derivatives in predetermined ratios; and a controller, said controller receiving said derivatives in predetermined ratios and having a look-up table of stored values of attenuation and phase correction, wherein said predistorter controller further comprises an analog to digital converter, a gain table, a phase table, and at least one digital to analog converter, and said analog to digital converter converts a signal detected from said first and second differentiators in less than 25 nanoseconds.

2. A predistorter as recited in claim 1, wherein said at least one digital to analog converter has an output which is fed into a dynamically variable attenuator.

3. A predistorter as recited in claim 1, wherein said at least one digital to analog converter has an output which is fed into a dynamically variable phase shifter.

* * * * *